US011257685B2

(12) United States Patent
Ventzek et al.

(10) Patent No.: US 11,257,685 B2
(45) Date of Patent: Feb. 22, 2022

(54) APPARATUS AND PROCESS FOR ELECTRON BEAM MEDIATED PLASMA ETCH AND DEPOSITION PROCESSES

(71) Applicant: Tokyo Electron Limited, Tokyo (JP)

(72) Inventors: Peter Ventzek, Austin, TX (US); Alok Ranjan, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/555,643

(22) Filed: Aug. 29, 2019

(65) Prior Publication Data

US 2020/0075346 A1 Mar. 5, 2020

Related U.S. Application Data

(60) Provisional application No. 62/760,383, filed on Nov. 13, 2018, provisional application No. 62/727,132, filed on Sep. 5, 2018.

(51) Int. Cl.
*H01L 21/322* (2006.01)
*H01L 21/02* (2006.01)
*H01L 21/3065* (2006.01)

(52) U.S. Cl.
CPC ...... *H01L 21/3221* (2013.01); *H01L 21/0228* (2013.01); *H01L 21/02274* (2013.01); *H01L 21/3065* (2013.01)

(58) Field of Classification Search
CPC ............ H01L 21/3221; H01L 21/0228; H01L 21/02274; H01L 21/3065; H01L 21/68785;

(Continued)

(56) References Cited

U.S. PATENT DOCUMENTS

2009/0081815 A1* 3/2009 Yamashita ........ H01J 37/32091
438/9
2011/0139748 A1* 6/2011 Donnelly .......... H01J 37/32146
216/37

(Continued)

OTHER PUBLICATIONS

Woodson et al, "Guided Growth of Nanoscale Conducting Polymer Structures on Surface-Functionalized Nanopatterns," J. Am. Chem. Soc. 128, 2006, pp. 3760-3763.*

(Continued)

*Primary Examiner* — Julia Slutsker
(74) *Attorney, Agent, or Firm* — Weihrouch IP

(57) ABSTRACT

Disclosed embodiments apply electron beams to substrates for microelectronic workpieces to improve plasma etch and deposition processes. The electron beams are generated and directed to substrate surfaces using DC (direct current) biasing, RF (radio frequency) plasma sources, and/or other electron beam generation and control techniques. For certain embodiments, DC-biased RF plasma sources, such as DC superposition (DCS) or hybrid DC-RF sources, are used to provide controllable electron beams on surfaces opposite a DC-biased electrode. For certain further embodiments, the DC-biased electrode is pulsed. Further, electron beams can also be generated through electron beam extraction from external and/or non-ambipolar sources. The disclosed techniques can also be used with additional electron beam sources and/or additional etch or deposition processes.

19 Claims, 9 Drawing Sheets

(58) Field of Classification Search
CPC .. H01J 37/3053; H01J 37/3178; H01J 37/077; H01J 37/32091; H01J 37/32155; H01J 37/32706; H01J 37/32366; H01J 37/32422

See application file for complete search history.

(56) References Cited

U.S. PATENT DOCUMENTS

| | | |
|---|---|---|
| 2011/0177694 A1 | 7/2011 | Chen et al. |
| 2012/0258606 A1 | 10/2012 | Holland et al. |
| 2015/0017810 A1* | 1/2015 | Guha ................ H01J 37/32449 438/714 |
| 2015/0041432 A1* | 2/2015 | Chen ....................... H01J 37/30 216/66 |
| 2016/0064244 A1 | 3/2016 | Agarwal et al. |
| 2016/0218004 A1* | 7/2016 | George ............... H01L 21/0228 |
| 2016/0276134 A1 | 9/2016 | Collins et al. |
| 2017/0042010 A1* | 2/2017 | Liang ....................... H05H 1/24 |
| 2017/0073814 A1* | 3/2017 | Bishop .................. C23C 16/487 |
| 2017/0125217 A1* | 5/2017 | Dorf ................. H01J 37/32422 |
| 2017/0200587 A1* | 7/2017 | Godet .............. H01J 37/32568 |
| 2018/0033611 A1* | 2/2018 | Liao .................. H01L 21/02071 |
| 2019/0122860 A1* | 4/2019 | Lee ................... H01J 37/32366 |

OTHER PUBLICATIONS

Korean Intellectual Property Office, The International Search Report and the Written Opinion for International application No. PCT/US2019/048838, dated Dec. 16, 2019, 12 pg.

* cited by examiner

APPARATUS AND PROCESS FOR ELECTRON BEAM MEDIATED PLASMA ETCH AND DEPOSITION PROCESSES

RELATED APPLICATIONS

This application claims priority to the following provisional applications: U.S. Provisional Patent Application Ser. No. 62/727,132, filed Sep. 5, 2018, and entitled "APPARATUS AND PROCESS FOR ELECTRON BEAM MEDIATED PLASMA ETCH AND DEPOSITION PROCESSES," and U.S. Provisional Patent Application Ser. No. 62/760,383, filed Nov. 13, 2018, and entitled "APPARATUS AND PROCESS FOR ELECTRON BEAM MEDIATED PLASMA ETCH AND DEPOSITION PROCESSES," which is hereby incorporated by reference in its entirety.

BACKGROUND

The present disclosure relates to methods for the manufacture of microelectronic workpieces, and in particular, methods to etch material layers on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, processing flows are being requested to reduce feature size while maintaining structure integrity for various patterning processes.

Atomic layer etch (ALE) and atomic layer deposition (ALD) require chemistry control at surfaces of substrates for microelectronic workpieces during plasma processing. Even with plasma generated radicals present, surface processes are thermal in nature and spatial control is problematic, whether performed microscopically (e.g., within features, over die, etc.) or macroscopically (e.g., across a wafer, at a wafer edge, etc.). For example, these problems arise during polymer growth for self-aligned contact (SAC) processes using quasi-ALE processing as well as during chlorination of sidewalls in ALE processing of silicon structures. These problems arise in other ALE and ALD processes as well as other etch/deposition processes for the manufacture of microelectronic workpieces.

SUMMARY

Embodiments are described herein that apply electron beams to substrates for microelectronic workpieces to improve plasma etch and deposition processes. The electron beams are generated and directed to substrate surfaces using DC (direct current) biasing, RF (radio frequency) plasma sources, and/or other electron beam generation and control techniques. For certain embodiments, DC-biased RF plasma sources, such as DC superposition (DCS) or hybrid DC-RF sources, are used to provide controllable electron beams on surfaces opposite a DC-biased electrode. For certain further embodiments, the DC-biased electrode is pulsed. For one further example, electron beam currents of 50 to 100 milliamps (mA) are used to provide enhanced productivity. Further, the processing chamber within which the controllable electron beams are used can be, for example, a 300 millimeter (mm) chamber. Still further, electron beams can also be generated through electron beam extraction from external and/or non-ambipolar sources. The disclosed techniques can also be used with additional electron beam sources and/or additional etch or deposition processes. Different or additional features, variations, and embodiments can also be implemented, and related systems and methods can be utilized as well.

For one embodiment, a method of processing a microelectronic workpiece is disclosed including generating an electron beam, delivering the electron beam to a substrate for a microelectronic workpiece within a processing chamber, and performing at least one of a plasma etch process or a plasma deposition process with respect to the surface of the microelectronic workpiece.

In additional embodiments, the delivering includes delivering the electron beam to one or more selected regions of the substrate to cause electron stimulated chemistry to be induced only for the one or more selected regions. In further embodiments, the method also includes using one or more masks to determine the one or more selected regions of the substrate. In still further embodiments, the electron stimulated chemistry promotes or inhibits at least one of an etch process, a deposition process, or a passivation process.

In additional embodiments, the delivering includes applying direct current (DC) biasing for at least one of the generating or the delivering. In further additional embodiments, the method includes applying a radio frequency (RF) bias to the substrate through a substrate holder during the delivering. In still further additional embodiments, the generating includes generating a current for the electron beam of 50 to 100 milliamps (mA).

In additional embodiments, the generating includes generating the electron beam through electron extraction performed within the processing chamber. In further embodiments, the method includes using a source plasma and direct current (DC) biasing for the generating. Further, the DC biasing can be pulsed. In still further embodiments, the method can include powering coils positioned around the processing chamber to sustain plasma within the processing chamber, and alternating the DC biasing, power to the coils, and radio frequency (RF) biasing of the substrate.

In additional embodiments, generating includes generating the electron beam through electron extraction external to the processing chamber and delivering the extracted electrons to the processing chamber. In further embodiments, the method includes using direct current (DC) biasing for the generating. In still further embodiments, the method includes powering coils positioned around the processing chamber to sustain plasma within the processing chamber, and alternating the DC biasing, power to the coils, and radio frequency (RF) biasing of the substrate.

In additional embodiments, the delivering and performing are used for an atomic layer deposition (ALD) process. In further embodiments, the delivering includes DC-biased delivery of the electron beam; the performing includes igniting a pre-cursor plasma gas; and the delivering and the performing are alternated to deposit a material layer on the substrate.

In additional embodiments, the delivering and performing are used for an atomic layer etch (ALE) process. In further embodiments, the delivering includes DC-biased delivery of the electron beam; the performing comprises at least one of a reactive ion etch (ME) or a radio frequency (RF) sputter; and the delivering and the performing are alternated to deposit a material layer on the substrate. In still further embodiments, the performing further includes igniting a pre-cursor plasma gas.

In additional embodiments, the performing includes delivering process gases to the processing chamber and using the delivered electron beam to stimulate surface modification of the substrate based upon chemistry of the process gases. In further embodiments, the performing includes vertical polymer growth.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

As described herein, electron beams are generated and controlled and delivered to substrates for microelectronic workpieces to improve plasma etch and deposition processes. The disclosed embodiments provide improved methods and process equipment solutions with reduced complexity to solve spatial control problems experienced in prior plasma etch and deposition processes. For example, disclosed embodiments can be used to improve ALE processes, ALD processes, hybrid ALE/ALD processes, and/or other plasma etch and/or deposition processes. Further, disclosed embodiments can be used with other processing chamber capabilities such as DCS, inductively coupled plasma (ICP), reactive ion etching (ME), and/or other etch or deposition capabilities. Other advantages can also be achieved while still taking advantage of the process techniques described herein.

As recognized for the embodiments herein, electron beams have a favored direction and can be delivered to a substrate, for example, by controlling the electron beams using electric fields and magnetic fields. Electrons for electron beams may be generated externally or within a processing chamber, for example, through secondary electron emission from a surface bombarded by ions (or electrons). Once generated, these electron beams are delivered to improve plasma etch and/or plasma deposition processes. It is noted for one embodiment that in situ delivery of electron beams can be provided to deliver the electron beams to the surface of the microelectronic workpiece while the microelectronic workpiece remains in the processing chamber.

Figure 1:
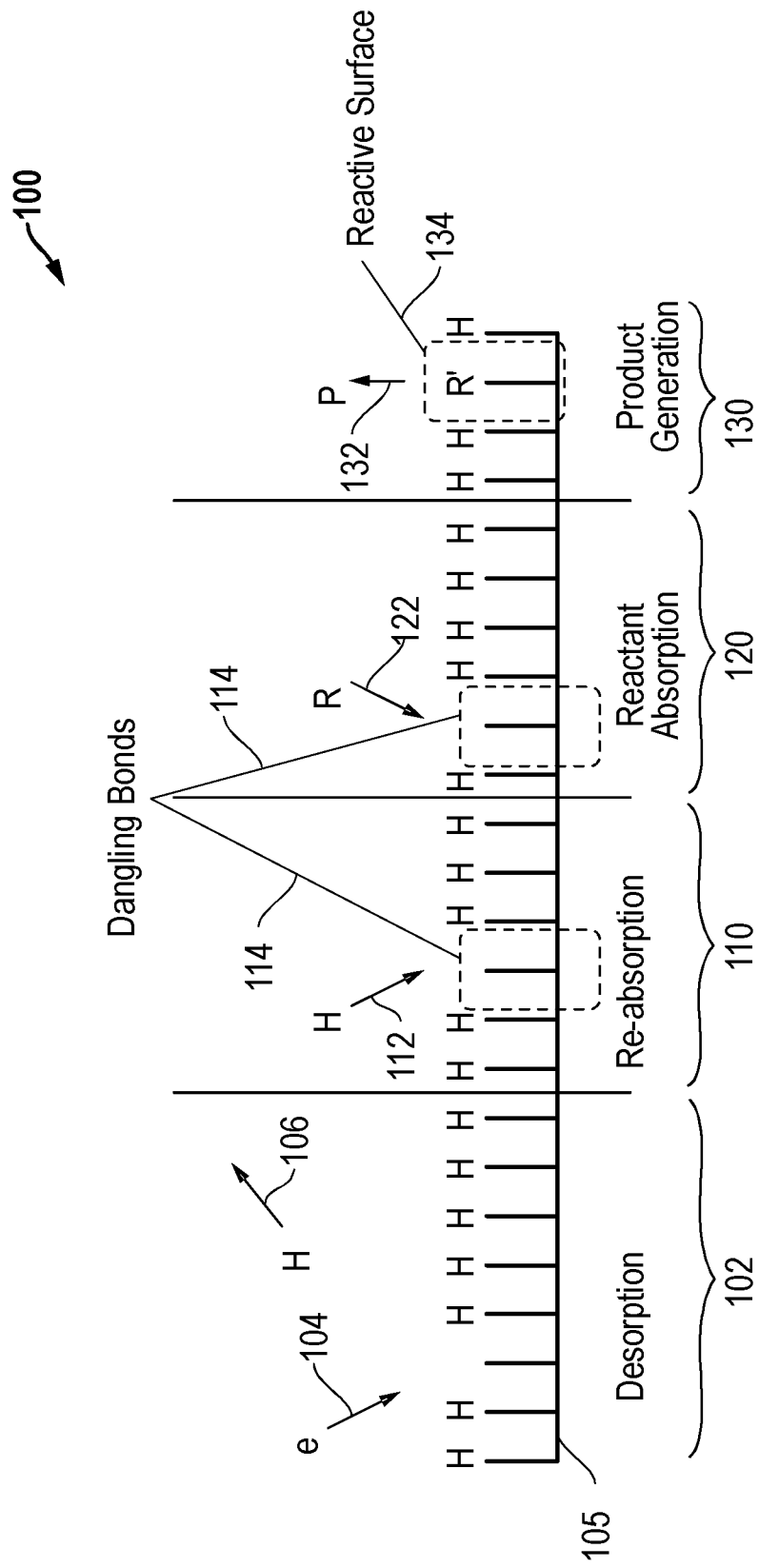
FIG. 1 is a diagram of an example embodiment for bonds on the surface of a substrate for a microelectronic workpiece being manufactured.

FIG. 1 is a diagram of an example embodiment 100 for bonds on the surface 105 of a substrate for a microelectronic workpiece being manufactured. Electrons 104 incident on the surface 105 generate dangling bonds 114 through bond breaking or through the stimulated desorption of hydrogen (H) atoms 106 or other species. These sites can be rapidly reacted with radicals or neutral species in plasma to facilitate plasma etch and/or plasma deposition processes.

Looking in more detail to FIG. 1, desorption 102 of H atoms 106 are caused by electrons 104 incident on the surface 105. This desorption 102 leaves dangling bonds 114. These dangling bonds 114 can re-acquire H atoms 112 in a re-absorption process 110 and/or acquire a reactant (R) 122 in a reactant absorption process 120. A reactant (R') absorbed by the dangling bond forms a reactive surface 134 that can facilitate etch and/or deposition processes where a reactant product (P) 132 is generated during a subsequent product generation process 130. As such, the dangling bonds 114 generated on the surface 105 by incident electrons 104 are useful for a variety of circumstances, and these dangling bonds 114 can improve selectivity of etch or deposition processes. For example, the H-terminated portions of the surface 105 are easily etched by plasma etch processes. The R'-terminated portions of the surface 105 provide reactive surfaces that are easily grown upon during plasma deposition processes. Further, the H-terminated portions of the surface 105 can be less volatile than the R'-terminated portions of the surface 105 for etch processes. Still further, the R'-terminated portions of surface 105 can be altered with an electron beam (e-beam) such that it is stimulated to become R" on which more R' or another layer can be grown. Additional and/or different processes and environments can also use the electron beam mediated techniques described herein.

Figure 2A:
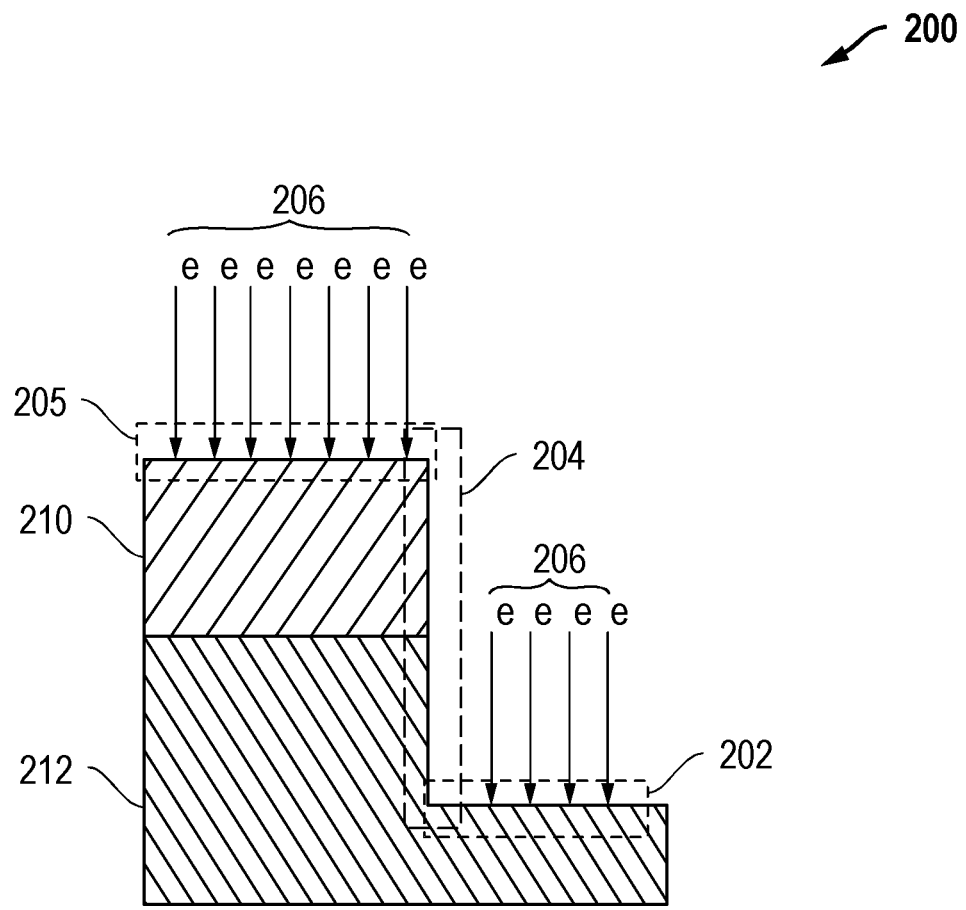
FIG. 2A is a diagram of an example embodiment where improved selectivity and anisotropy are achieved using electron beam mediated processing techniques.

FIG. 2A is a diagram of an example embodiment 200 where improved selectivity and anisotropy are achieved using the electron beam mediated techniques described herein. For one embodiment, the surfaces can be passivated (e.g., with chlorine, bromine, fluorine, fluorocarbons, hydrogen, oxygen, and/or other material). A portion of the surface is then removed, for example, using a cyclic etch process. For the embodiment 200 shown, a patterned structure or stack 212 is previously formed on a substrate using one or more masks and related process steps. A portion of a mask 210 is left as a protective layer, and an incident electron beam 206 is generated using one or more electron beam sources. This incident electron beam 206, for example, can be directed in a normal direction with respect to the surface of the mask 210 and/or the stack 212. Electron stimulated chemistry is then induced in selected regions 202 due to the normal incidence of this electron beam 206. The surface region 205 for the mask 210 is not impacted or minimally impacted by the electron beam 206 and can be removed by one or more further etch processes. The vertical surface region 204 of the stack 212 and mask 210 are not impacted or minimally impacted by the electron stimulation due to the direction of the electron beam 206. The horizontal surface regions 202 of the substrate is modified by electron stimulated chemistry from the electron beam 206. In this way, the electron beam 206 is delivered to one or more selected regions 202 of a substrate to cause electron stimulated chemistry to be induced for the one or more selected regions 202. Although a single mask 210 is shown, the selected regions can be determined using one or more masks and related patterning of mask layers. Further, the electron stimulated chemistry promotes or inhibits one or more of an etch process, a deposition process, a passivation process, and/or other desired processes. For one example implementation, this technique can be used to facilitate polymer growth with vertical selectivity on surfaces where electron stimulation occurs. It is also noted that the passivation can be achieved, for example, using e-beam exposure followed by deposition or etchant precursor exposure (sequentially or simultaneously). Other variations could also be implemented while still taking advantage of the electron beam mediated techniques described herein.

Figure 2B:
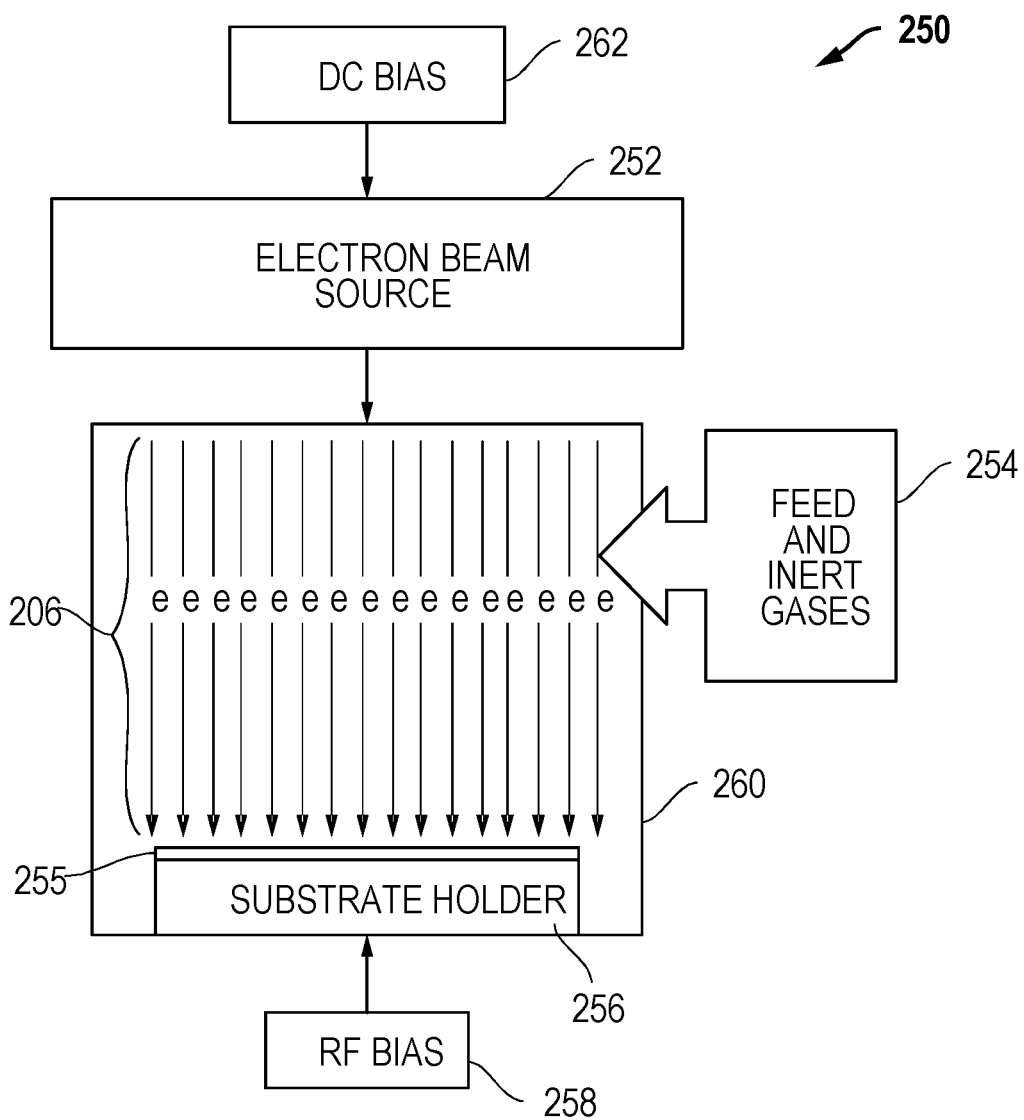
FIG. 2B is a diagram of an example embodiment including a processing chamber where an electron beam is delivered to a substrate for a microelectronic workpiece being processed thereby improving plasma etch/deposition processes.

FIG. 2B is a diagram of an example embodiment 250 including a processing chamber 260 where an electron beam 206 is delivered to a substrate 255 for a microelectronic workpiece being processed. For one embodiment, the substrate 255 is held by a substrate holder 256. For one example embodiment, the substrate holder 256 is an electrostatic chuck. As shown, an electron beam source 252 generates the electrons for the electron beam 206 and then delivers the electron beam 206 to the surface of the substrate 255. Preferably, a negative DC bias 262 is applied to the electron beam source 252 and facilitates the generation and/or delivery of the electron beam 206 to the substrate 255. Feed and inert gases 254 are also delivered to the processing chamber 260 to provide gas chemistries used for one or more processes performed within the processing chamber 260. For example, plasma gas chemistries can be delivered to the processing chamber 260 for plasma etch processes and/or plasma deposition processes. For one embodiment, an electron beam 206 is delivered to the surface of the substrate 255 while a deposition precursor is simultaneously injected into the processing chamber 260.

It is noted that for plasma processing, plasma can be ignited and maintained within the processing chamber using high frequency (HF) techniques, very high frequency (VHF) techniques, ICP techniques, and/or other plasma generation techniques. It is further noted that DC-biased or pulsed DC-biased plasma sources, such as RF plasma sources, can be used as the electron beam source 252. Other electron sources can also be used. As one example, a current of 112 mA (milliamps) from a 700 square centimeter ($cm^2$) surface is used to generate an electron beam that impacts one monolayer of a substrate surface in one second. For another example, a current of about 50 mA is used. In addition, a radio frequency (RF) bias 258 can be applied to the substrate 255 for the microelectronic workpiece, for example, through the substrate holder 256. This RF bias 258 can be used to facilitate the plasma processes and/or inhibit ballistic electrons as maximum flux typically occurs when RF is off at the substrate 255 for the microelectronic workpiece. Other variations could also be implemented while still taking advantage of the electron beam mediated techniques described herein.

Figure 3:
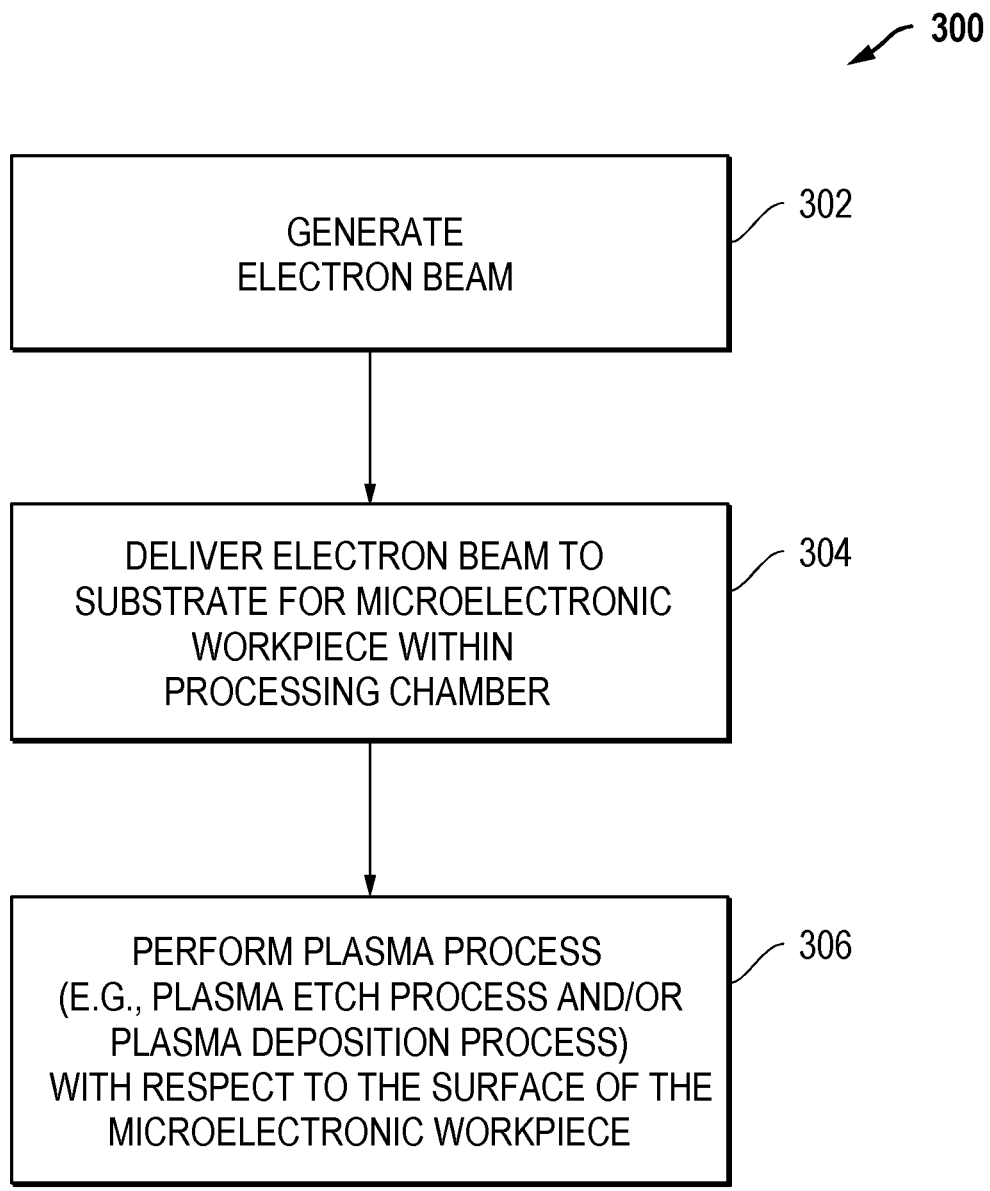
FIG. 3 is a process flow diagram of an example embodiment where an electron beam is used to facilitate plasma processing within a processing chamber.

FIG. 3 is a process flow diagram of an example embodiment 300 where an electron beam is used to facilitate plasma processing within a processing chamber. In block 302, an electron beam is generated. In block 304, the electron beam is delivered to the substrate for a microelectronic workpiece within the processing chamber. In block 306, one or more plasma processes are performed with respect to the surface of the microelectronic workpiece. The plasma processes can be, for example, at least one of a plasma etch process or a plasma deposition process. It is further noted that additional and/or different process steps could also be used while still taking advantage of the disclosed techniques.

Figure 4A:
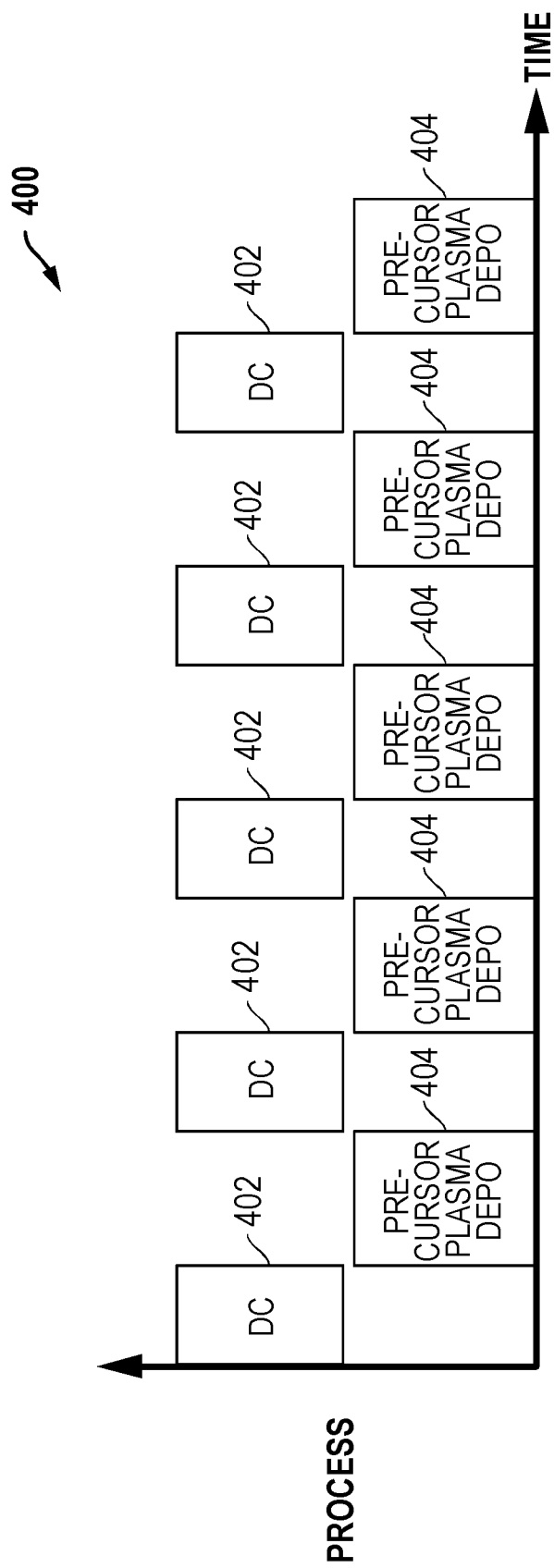
FIG. 4A is a diagram of an example embodiment for an ALD process that is mediated and improved with an electron beam generated and delivered to the surface of the substrate for a microelectronic workpiece during process steps.

FIG. 4A is a diagram of an example embodiment 400 for an ALD process that is mediated and improved with an electron beam source delivering electron beams to the surface of the substrate for a microelectronic workpiece during process steps. For the example embodiment 400 depicted, a sequence of DC-biased e-beam processes (DC) 402 and pre-cursor plasma deposition processes 404 are used for the example ALD process. For the DC-biased e-beam processes 402, an electron beam source along with a DC-bias is used to generate and deliver an electron beam to the surface of the substrate within a processing chamber. The pre-cursor plasma deposition processes 404 include a deposition of one or more layers using a pre-cursor gas and plasma processing steps. For this example ALD process, no RF bias is used, and purge steps are implied. Other variations could also be implemented.

Figure 4B:
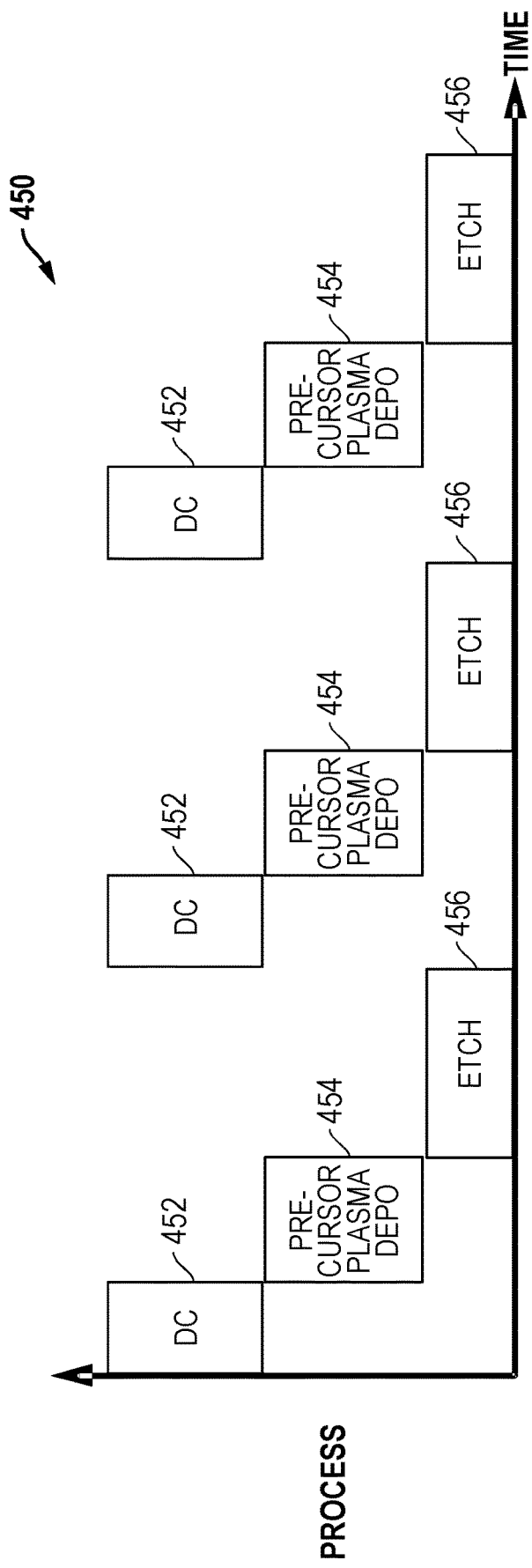
FIG. 4B is a diagram of an example embodiment for an ALE process that is mediated and improved with an electron beam generated and delivered to the surface of the substrate for microelectronic workpiece during process steps.

FIG. 4B is a diagram of an example embodiment 450 for an ALE process that is mediated and improved with an electron beam source delivering electron beams to the surface of the substrate for microelectronic workpiece during process steps. For the example embodiment 450 depicted, a sequence of DC-biased e-beam processes (DC) 452, pre-cursor plasma deposition processes 454, and plasma etch processes 456 are used for the example ALE process. For the DC-biased e-beam processes 452, an electron beam source along with a DC-bias is used to generate and deliver an electron beam to the surface of the substrate within a processing chamber. The pre-cursor plasma deposition processes 454 include a deposition of one or more layers using a pre-cursor gas and plasma processing steps. For one example ALE process, an RF sputter and/or RIE are used for the etch processes 456, and the pre-cursor deposition processes 454 are used to improve selectivity for the plasma etch processes 456. Further, for one example ALE process, an RF bias can also be applied to the substrate for the microelectronic workpiece being processed to facilitate material removal from the substrate during the etch processes 456. Other variations could also be implemented.

Figure 5A:
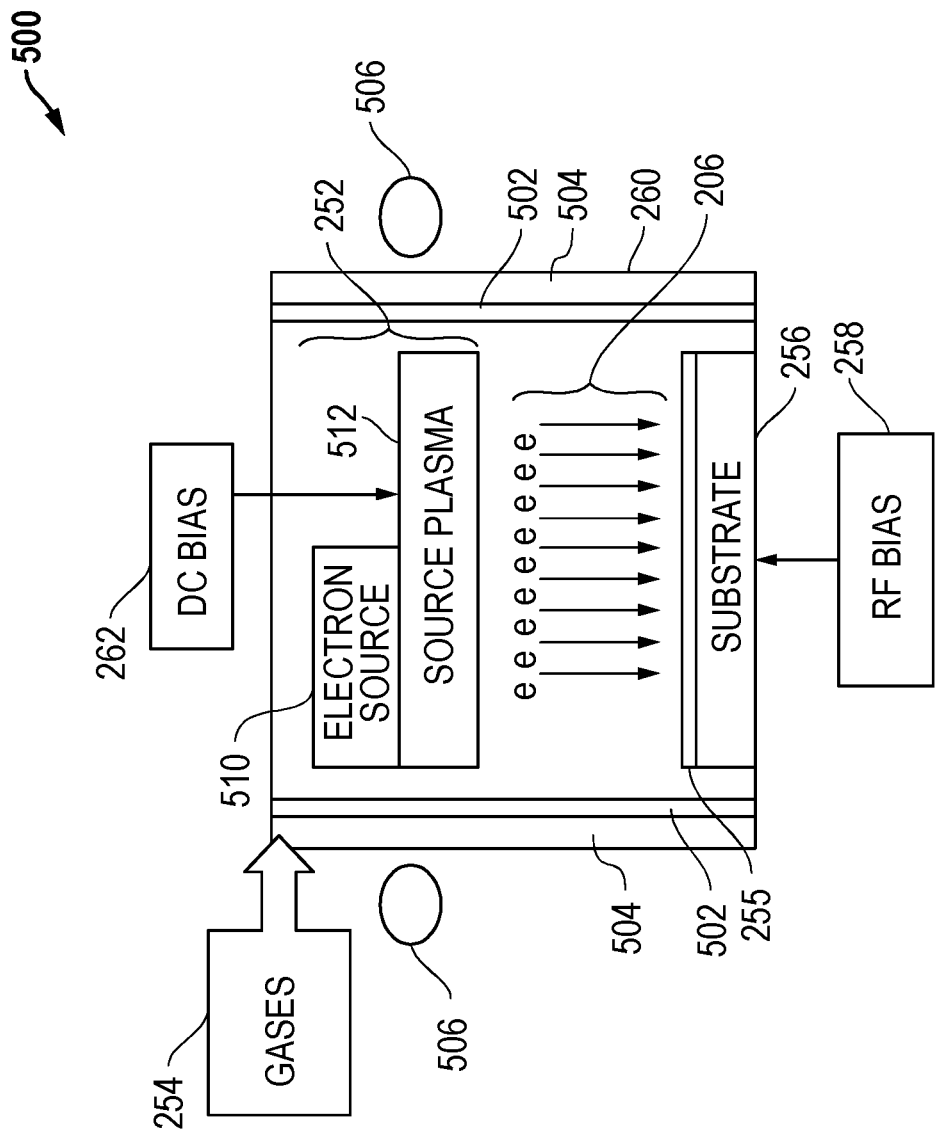
FIG. 5A is a diagram of an example embodiment where an electron beam is generated using an electron source that extracts electrons within the processing chamber.

FIG. 5A is a diagram of an example embodiment 500 where an electron beam 206 is generated using an electron source 510 that extracts electrons within the processing chamber 260. For example, the electrons for the electron beam source 252 can be generated through electron extraction from a large hollow cathode as the electron source 510, and a source plasma 512 can be used to deliver the electron beam 206. A DC bias 262 can also be applied to the source plasma 512 in order to facilitate generation and/or delivery of the electron beam 206. For example, DC or pulsed-DC techniques can be used with respect to a metal or highly doped silicon (Si) in order to generate electrons and deliver electron beam 206 to the substrate 255. In one embodiment, a DC-biased or pulsed DC-biased RF plasma source is used to deliver the electron beam 206. Plasma and/or other process gases 254 is delivered to the processing chamber 260, and source plasma 512 can be ignited to facilitate delivery of the electron beam 206 to the substrate 255. An RF bias 258 can also be applied to the substrate 255. Optional RF power can also be generated and applied to the processing chamber 260 as part of the plasma generation. The processing chamber 260 can also include coils 506, a Faraday shield 504, and a quartz liner 502. Further, it is noted that the DC bias 262, RF bias 258, and coils 506 can be operated in an alternating manner. It is noted that the coils 506 can be positioned around the processing chamber 260 and can be used to generate source power that sustains plasma within the processing chamber 260. Other variations can also be implemented while still taking advantage of the techniques described herein.

Figure 5B:
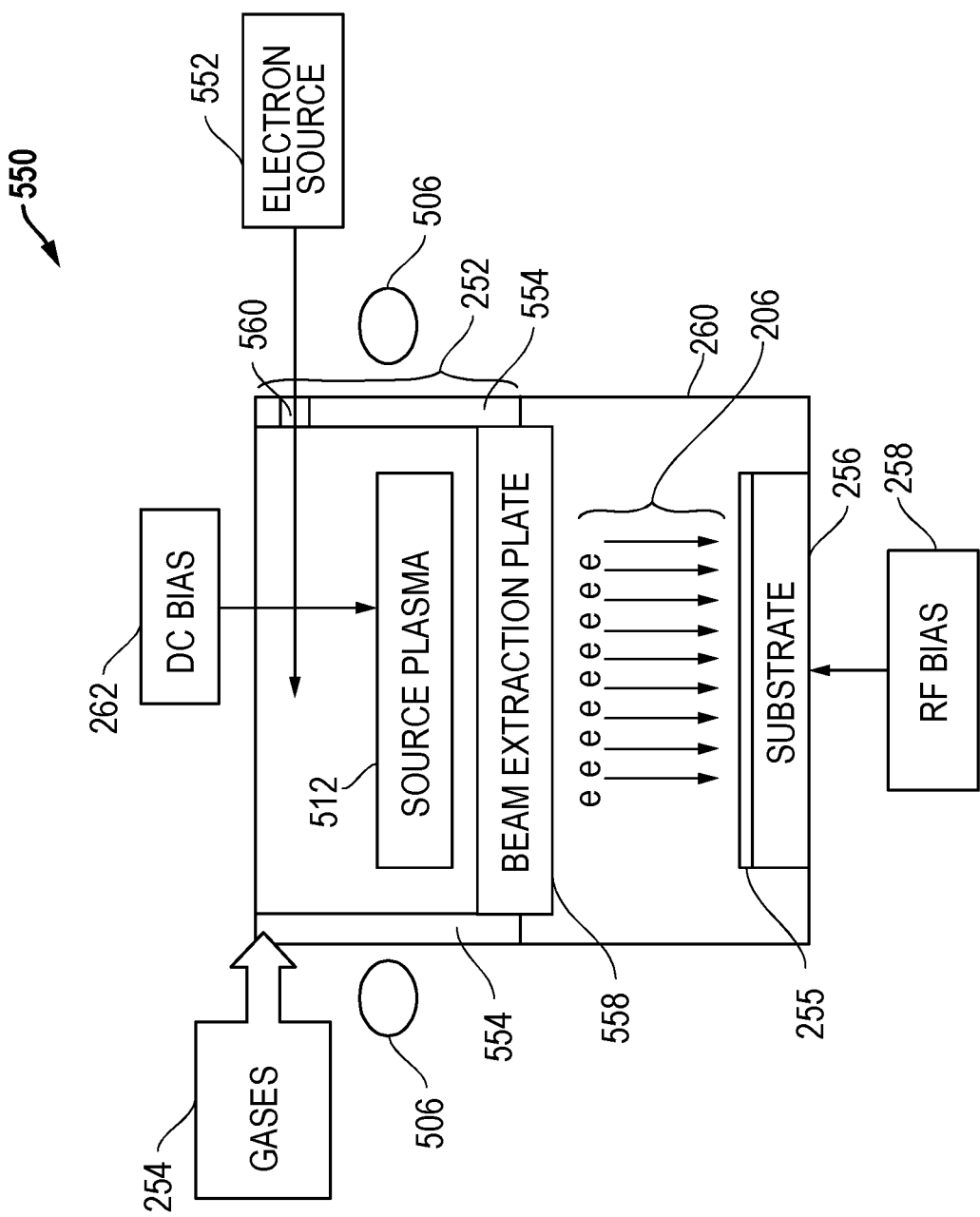
FIG. 5B is a diagram of an example embodiment where an electron beam is generated using an external electron source that performs extraction of electrons outside of the processing chamber.

FIG. 5B is a diagram of an example embodiment 550 where an electron beam 206 is generated using an external electron source 552 that performs extraction of electrons outside of the processing chamber 260. Source plasma 512 can be used to facilitate the generation and deliver of the electron beam 206 for the electron beam source 252. In addition, a beam extraction plate 558 can be used within the processing chamber 260 to absorb electrons injected within the processing chamber 260 by the external electron source 552 and then deliver an electron beam 206 to the substrate 255. Plasma and/or other process gases 254 is delivered to the processing chamber 260, and the source plasma 512 can be ignited within the processing chamber 260. An RF bias 258 can also be applied to the substrate 255. The processing chamber 260 can also include coils 506 and a dielectric material liner 554. DC bias 262 can be applied to the source plasma 512 near the electron extraction hole area 560. Other variations can also be implemented while still taking advantage of the techniques described herein.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

Figure 6:
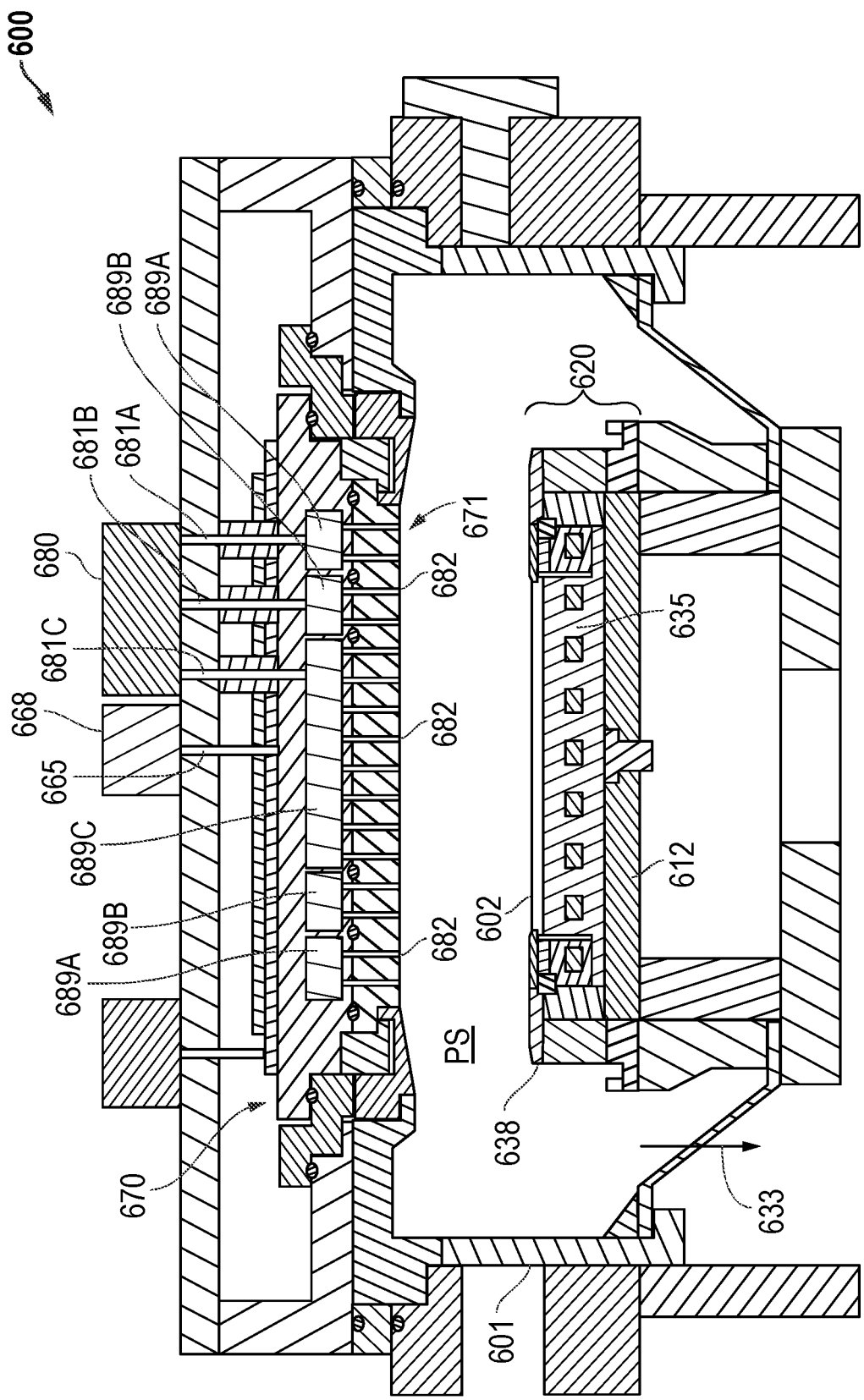
FIG. 6 is a block diagram of an example embodiment for a workpiece manufacturing system, such as a plasma processing apparatus, that can be used as a processing chamber for the embodiments described herein.

An embodiment 600 for an example plasma etch processing system is described with respect to FIG. 6. It is noted, however, that the techniques described herein may be utilized with a wide range of etch processing systems, and the embodiment 600 is simply one example embodiment.

FIG. 6 is a block diagram of an example embodiment 600 for a workpiece manufacturing system, such as a plasma processing apparatus, that can be used as a processing chamber for the embodiments described herein. More particularly, FIG. 6 illustrates one example embodiment for a plasma processing apparatus merely for illustrative purposes that can be used to implement the processing techniques described herein. It will be recognized that other plasma process systems and other etch process systems may equally implement the techniques described herein. For the example embodiment 600 of FIG. 6, a schematic cross-sectional view is provided for a capacitively coupled plasma processing apparatus including a process space (PS) that provides an etch chamber for microelectronic workpieces. Alternative plasma process apparatus may also be utilized, including for example, but not limited to, inductively coupled plasma processing apparatus, microwave plasma processing apparatus, and the like. A capacitively coupled plasma processing apparatus may be particularly well suited as the electrode spacing of such apparatus allow beneficial control of gases to a localized region of the plasma space, thus providing localized plasma processing on the substrate.

The plasma processing apparatus 600 can be used for multiple operations including ashing, etching, deposition, cleaning, plasma polymerization, plasma-enhanced chemical vapor deposition (PECVD), atomic layer deposition (ALD) and so forth. The structure of a plasma processing apparatus 600 is well known, and the particular structure provided herein is merely exemplary. Plasma processing can be executed within processing chamber 601, which can be a vacuum chamber made of a metal such as aluminum or stainless steel. The processing chamber 601 defines a processing vessel providing a process space (PS) for plasma generation. An inner wall of the processing vessel can be coated with alumina, yttria, or other protectant. The processing vessel can be cylindrical in shape or have other geometric configurations.

At a lower, central area within the processing chamber 601, a susceptor 612 (which can be disc-shaped) can serve as a mounting table on which, for example, a substrate 602 to be processed (such as a semiconductor wafer) can be mounted. Substrate 602 can be moved into the processing chamber 601 through a loading/unloading port and gate valve. Susceptor 612 forms part of a lower electrode assembly 620 as an example of a second electrode acting as a mounting table for mounting substrate 602 thereon. The susceptor 612 can be formed of, e.g., an aluminum alloy. Susceptor 612 is provided thereon with an electrostatic chuck (as part of the lower electrode assembly) for holding the substrate 602. The electrostatic chuck is provided with an electrode 635. Electrode 635 is electrically connected to direct current (DC) power source, not shown. The electrostatic chuck attracts the substrate 602 thereto via an electrostatic force generated when DC voltage from the DC power source is applied to the electrode 635. The susceptor 612 can be electrically connected with a high-frequency power source via a matching unit. For other embodiments and processing chambers, two or more power sources can be used and connected to electrode 635 and/or other electrodes within the processing chambers. This high-frequency power source (a second power source) can output a high-frequency voltage in a range from, for example, 2 MHz (megahertz) to 20 MHz. Applying high frequency bias power causes ions, in plasma generated in the processing chamber 601, to be attracted to substrate 602. A focus ring assembly 638 is provided on an upper surface of the susceptor 612 to surround the electrostatic chuck.

An exhaust path 633 can be formed through one or more exhaust ports (not shown) which connect to a gas exhaust unit. The gas exhaust unit can include a vacuum pump such as a turbo molecular pump configured to pump out the plasma processing space within the processing chamber 601 to a desired vacuum condition. The gas exhaust unit evacuates the inside of the processing chamber 601 thereby depressurizing the inner pressure thereof down to the desired degree of vacuum.

An upper electrode assembly 670 is an example of a first electrode and is positioned vertically above the lower electrode assembly 620 to face the lower electrode assembly 620 in parallel. The plasma generation space or process space (PS) is defined between the lower electrode assembly 620 and the upper electrode assembly 670. The upper electrode assembly 670 includes an inner upper electrode 671, having a disk shape, and an outer upper electrode which may be annular and surrounding a periphery of the inner upper electrode 671. The inner upper electrode 671 also functions as a processing gas inlet for injecting a specific amount of processing gas into the process space (PS) above substrate 602 mounted on the lower electrode assembly 620. The upper electrode assembly 670 thereby forms a showerhead. More specifically, the inner upper electrode 671 includes gas injection openings 682.

The upper electrode assembly 670 may include one or more buffer chamber(s) 689A, 689B, and 689C. The buffer chambers are used for diffusing process gas and can define a disk-shaped space. Processing gas from a process gas supply system 680 supplies gas to the upper electrode assembly 670. The process gas supply system 680 can be configured to supply a processing gas for performing specific processes, such as film-forming, etching, and the like, on the substrate 602. The process gas supply system 680 is connected to gas supply lines 681A, 681B, and 681C forming a processing gas supply path. The gas supply lines are connected to the buffer chambers of the inner upper electrode 671. The processing gas can then move from the buffer chambers to the gas injection openings 682 at a lower surface thereof. A flow rate of processing gas introduced into the buffer chambers 689A-C can be adjusted by, e.g., by using a mass flow controller. Further, the processing gas introduced is discharged from the gas injection openings 682 of the electrode plate (showerhead electrode) to the process space (PS). The inner upper electrode 671 functions in part to provide a showerhead electrode assembly.

As shown in FIG. 6, three buffer chambers 689A, 689B, and 689C are provided corresponding to edge buffer chamber 689A, middle buffer chamber 689B and center buffer chamber 689C. Similarly, gas supply lines 681A, 681B, and 681C may be configured as edge gas supply line 681A, middle gas supply line 681B and center gas supply line 681C. The buffer chambers are provided in a manner corresponding to different localized regions of the substrate in this case edge, middle and center. As will be discussed more below, these regions may correspond to specific process plasma process conditions for localized regions of the substrate 602. It will be recognized that the use of three localized regions is merely exemplary. Thus, the plasma processing apparatus may be configured to provided localize plasma process conditions on any number of regions of the substrate. It is further again noted that any of a variety of configurations may be utilized, and the techniques described herein are not limited to the manner in which the process gas supply system 680 is configured to split the gas flows to the various buffer chambers.

The upper electrode assembly 670 is electrically connected with a high-frequency power source (not shown) (first high-frequency power source) via a power feeder 665 and a matching unit 668. The high-frequency power source can output a high-frequency voltage having a frequency of 40 MHz (megahertz) or higher (e.g., 60 MHz), or can output a very high frequency (VHF) voltage having a frequency of 30-300 MHz. This power source can be referred to as the main power supply as compared to a bias power supply. It is noted for certain embodiments there is no power source for the upper electrodes, and two power sources are connected to the bottom electrode. Other variations could also be implemented.

Components of the plasma processing apparatus can be connected to, and controlled by, a control unit, which in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. In operation, the plasma processing apparatus uses the upper and lower electrodes to generate a plasma in the process space (PS). This generated plasma can then be used for processing a target substrate (such as substrate 602 or any material to be processed) in various types of treatments such as plasma etching, chemical vapor deposition, treatment of semiconductor material, glass material and large panels such as thin-film solar cells, other photovoltaic cells, and organic/inorganic plates for flat panel displays, etc.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of processing a microelectronic workpiece, the method comprising:
    generating an electron beam;
    delivering the electron beam to a substrate for the microelectronic workpiece within a processing chamber to desorb hydrogen from an exposed surface of the substrate and leave dangling bonds in a material of the surface of the substrate, wherein delivering the electron beam to the substrate comprises applying negative direct current (DC) biasing;
    powering coils positioned around the processing chamber to sustain plasma within the processing chamber;
    radio frequency (RF) biasing the substrate;
    alternating the negative DC biasing, the powering the coils, and the RF biasing of the substrate; and
    performing at least one of a plasma etch process or a plasma deposition process with respect to the surface of the microelectronic workpiece.

2. The method of claim 1, wherein the delivering comprises delivering the electron beam to one or more selected regions of the substrate to cause electron stimulated chemistry to be induced for the one or more selected regions.

3. The method of claim 2, further comprising using one or more masks to determine the one or more selected regions of the substrate.

4. The method of claim 2, wherein the electron stimulated chemistry promotes or inhibits at least one of an etch process, a deposition process, or a passivation process.

5. The method of claim 1, wherein the negative DC biasing is applied at a location above the substrate.

6. The method of claim 5, further comprising applying a radio frequency (RF) bias to the substrate through a substrate holder during the delivering.

7. The method of claim 1, wherein the generating comprises generating a current for the electron beam of 50 to 100 milliamps (mA).

8. The method of claim 1, wherein the generating comprises generating the electron beam through electron extraction performed within the processing chamber.

9. A method of processing a microelectronic workpiece, the method comprising:
    using a source plasma and a negative direct current (DC) bias to direct an electron beam onto an exposed surface of a substrate on a substrate holder to form dangling bonds on the exposed surface of the substrate, wherein the negative DC bias is applied at a location above the substrate;
    powering coils positioned around the processing chamber to sustain plasma within the processing chamber;
    radio frequency (RF) biasing the substrate;
    alternating the negative DC bias, the powering the coils, and the RF biasing of the substrate; and
    after directing the electron beam onto the exposed surface of the substrate, performing a plasma etch or a plasma deposition on the exposed surface.

10. The method of claim 9, wherein the DC bias is pulsed.

11. The method of claim 1, further comprising using direct current (DC) biasing for the generating.

12. The method of claim 1, wherein the delivering and performing are used for an atomic layer deposition (ALD) process, wherein the performing comprises igniting a pre-cursor plasma gas, and wherein the delivering and the performing are alternated to deposit a material layer on the substrate.

13. The method of claim 1, wherein the delivering and performing are used for an atomic layer etch (ALE) process.

14. The method of claim 13, wherein the delivering comprises DC-biased delivery of the electron beam, wherein the performing comprises at least one of a reactive ion etch (RIE) or a radio frequency (RF) sputter, and wherein the delivering and the performing are alternated to deposit a material layer on the substrate.

15. The method of claim 14, wherein the performing further comprises igniting a pre-cursor plasma gas.

16. The method of claim 1, wherein the performing comprises vertical polymer growth.

17. A method of processing a substrate, comprising:
    alternatingly performing steps (i) and (ii) in a processing chamber including:
        (i) delivering an electron beam to a surface of the substrate on a workpiece holder in the processing chamber, wherein the delivering includes applying a negative direct current (DC) bias at a location above the substrate and forming dangling bonds in a material of the surface of the substrate; and
        (ii) after the delivering of the electron beam, performing a plasma deposition of a precursor gas on the surface of the substrate;
    wherein the method further comprises:

applying a radio frequency (RF) biasing power to the substrate through the workpiece holder;

powering coils positioned around the processing chamber to sustain plasma within the processing chamber; and alternating the negative DC bias, the powering the coils, and the RF biasing of the substrate.

18. The method of claim 17, wherein:

the material of the surface of the substrate includes hydrogen and the forming of the dangling bonds includes using the electron beam to desorb hydrogen from the material; and the substrate includes a mask, and the surface to which the electron beam is delivered and the precursor is deposited is exposed through the mask.

19. The method of claim 18, further including, in the alternatingly performing steps (i) and (ii), performing an etch step (iii) after each depositing of the precursor in step (ii).

* * * * *